(12) United States Patent
Kaneko et al.

(10) Patent No.: US 8,216,378 B2
(45) Date of Patent: Jul. 10, 2012

(54) REACTION TUBE AND HEAT PROCESSING APPARATUS FOR A SEMICONDUCTOR PROCESS

(75) Inventors: Hirofumi Kaneko, Oshu (JP); Hisashi Inoue, Fuchu (JP); Keishi Shionaga, Fuchu (JP); Shingo Hishiya, Nirasaki (JP); Atsushi Endoh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 615 days.

(21) Appl. No.: 12/408,977

(22) Filed: Mar. 23, 2009

(65) Prior Publication Data
US 2009/0250005 A1    Oct. 8, 2009

(30) Foreign Application Priority Data
Apr. 3, 2008    (JP) .................................. 2008-097550

(51) Int. Cl.
*C23C 16/00*    (2006.01)
(52) U.S. Cl. ......................................... 118/724; 118/50
(58) Field of Classification Search .................. 118/724, 118/50; 219/390, 391, 496, 411
See application file for complete search history.

(56) References Cited

U.S. PATENT DOCUMENTS

| | | | |
|---|---|---|---|
| 6,187,102 B1 * | 2/2001 | Yamamoto | 118/725 |
| 7,700,898 B2 * | 4/2010 | Seo et al. | 219/390 |
| 7,762,809 B2 * | 7/2010 | Takahashi et al. | 432/242 |
| 2008/0090195 A1 * | 4/2008 | Takahashi et al. | 432/250 |
| 2009/0194521 A1 * | 8/2009 | Kobayashi et al. | 219/520 |
| 2009/0250005 A1 * | 10/2009 | Kaneko et al. | 118/724 |

FOREIGN PATENT DOCUMENTS
JP    2004-111715    4/2004
* cited by examiner

*Primary Examiner* — Sylvia R. MacArthur
(74) *Attorney, Agent, or Firm* — Smith, Gambrell & Russell, LLP

(57) ABSTRACT

A reaction tube for a semiconductor process for performing a heat process on a plurality of target objects stacked at intervals under a vacuum state is integrally made of an electrically insulating and heat-resistant material. The reaction tube includes a cylindrical sidewall that has a load port at a lower end for loading and unloading the target objects to and from the reaction tube, and a circular ceiling wall that closes an upper end of the sidewall and has a flat inner surface extending in a direction perpendicular to an axial direction of the sidewall. The ceiling wall has an annular groove formed in a peripheral region of an outer surface along the sidewall.

20 Claims, 13 Drawing Sheets

REACTION TUBE AND HEAT PROCESSING APPARATUS FOR A SEMICONDUCTOR PROCESS

BACKGROUND OF THE INVENTION

1. Field of the Invention

The present invention relates to a reaction tube for a semiconductor process for performing a process on target objects under a vacuum atmosphere, and a heat processing apparatus using the reaction tube. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

FIG. 12 is a view showing an example of a vertical heat processing apparatus (vertical furnace) used in a semiconductor manufacturing system. This apparatus includes a vertical quartz reaction tube 101 having an exhaust port 105 on the lower side. When a predetermined heat process is performed, a wafer boat 145 with a number of semiconductor wafers (which may be simply referred to as wafers) W stacked thereon at intervals is loaded into the reaction tube 101, which is then airtightly closed by a lid 143a. Then, the interior of the reaction tube 101 is heated by a heater 102 while a process gas is supplied into the reaction tube 101. There are various types of gas supply structure for such reaction tubes. In this example, a vertically long narrow gas supply duct 106 is attached to the outer surface of the reaction tube 101, and holes 107 are formed in the wall of the reaction tube 101, so that a gas is supplied from the duct through the holes 107 into the reaction tube 101.

Heat processes performed in vertical heat processing apparatuses include processes performed under a vacuum atmosphere, such as CVD (Chemical Vapor Deposition), ALD (Atomic Layer Deposition), and annealing. The vertical heat processing apparatus described above is used to perform such heat processes.

The reaction tube 101 suffers a stress directed inward due to a pressure difference generated between the outside and inside when the pressure inside the reaction tube 101 is set to be a vacuum. Consequently, a stress concentration occurs at the junction between the sidewall and the closed end wall of the reaction tube 101, and may bring about a breakdown stress, which causes implosion of the reaction tube (the reaction tube 101 is broken inward due to a pressure difference between the outside and inside). In order to prevent this problem, the conventional reaction tube is structured such that the closed end wall has a domed shape projected outward to disperse the stress by the rounded corner of the domed shape.

When a heat process is performed in the conventional reaction tube 101, however, the heat of wafers W is discharged upward from the reaction tube 101 through a space 103 inside the domed shape, as shown in FIG. 13, and so the temperature of the wafers W is lowered near their center. Further, a process gas supplied from the sidewall of the reaction tube 101 does not swiftly flow as a whole into a process field 120 for processing the wafers W, but partly flows into the upper space 103. Since the upper space 103 has a domed shape and thus is wide, part of the process gas flowing therethrough has a lower flow velocity, and so this part stays in the upper space 103 for a longer time and is more decomposed, as compared with part of the process gas inside the process field 120. In this case, decomposed part of the gas more flows around the peripheral portion of wafers W near the upper space 103, of the wafers W held on the wafer boat 145. Consequently, the film formation rate is higher on the peripheral portion of these wafers W and deteriorates the planar uniformity on these wafers W. Further, where decomposed part of the gas more flows around the peripheral portion of wafers W near the upper space 103, the average film thickness on these wafers W becomes larger than that of the wafers W therebelow, and so the inter-wafer uniformity of the film thickness may be also deteriorated.

In order to solve the problems described above, there is a conventional heat processing apparatus including a heat insulation body disposed on a wafer boat to prevent heat from being discharged from wafers W on the upper side (Jpn. Pat. Appln. KOKAI Publication No. 2004-111715 (Patent Document 1: Paragraph No. 0030 and FIG. 1)). According to this heat processing apparatus of Patent Document 1, the heat insulation body prevents the temperature of wafers W on the upper side from being changed. However, a gas can still stay in the upper space, and so the inter-wafer uniformity of the film thickness may be deteriorated. Further, the boat needs to be longer by that much corresponding to the length of the heat insulation body, and thereby increases the size of the apparatus. Further, reaction product components deposited on the heat insulation body may be peeled off and generate particles due to the difference in the coefficient of thermal expansion and contraction between the reaction product components and heat insulation body. In addition, the heat insulation body may be broken due to a heat shock.

BRIEF SUMMARY OF THE INVENTION

An object of the present invention is to provide a reaction tube that has a flat closed end wall but does not cause implosion when it is set in a vacuum state, and a heat processing apparatus provided with the reaction tube, which can perform a heat process with high uniformity.

According to a first aspect of the present invention, there is provided a reaction tube for a semiconductor process for performing a heat process on a plurality of target objects stacked at intervals under a vacuum state, the reaction tube being integrally made of an electrically insulating and heat-resistant material and comprising: a cylindrical sidewall that has a load port at a lower end for loading and unloading the target objects to and from the reaction tube; and a circular ceiling wall that closes an upper end of the sidewall and has a flat inner surface extending in a direction perpendicular to an axial direction of the sidewall, the ceiling wall having an annular groove formed in a peripheral region of an outer surface along the sidewall.

According to a second aspect of the present invention, there is provided a heat processing apparatus for a semiconductor process, the apparatus comprising: a reaction tube for performing a heat process on a plurality of target objects stacked at intervals under a vacuum state; a heater that surrounds the reaction tube; a substrate holder configured to hold the target objects inside the reaction tube; a gas supply system connected to the reaction tube and configured to supply a process gas into the reaction tube; and an gas exhaust system connected to the reaction tube and configured to vacuum-exhaust gas from inside the reaction tube, wherein the reaction tube is integrally made of an electrically insulating and heat-resistant material and comprises a cylindrical sidewall that has a load port at a lower end for loading and unloading the target objects to and from the reaction tube, and a circular ceiling wall that closes an upper end of the sidewall and has a flat inner surface extending in a direction perpendicular to an axial direction of the sidewall, the ceiling wall having an annular groove formed in a peripheral region of an outer surface along the sidewall.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
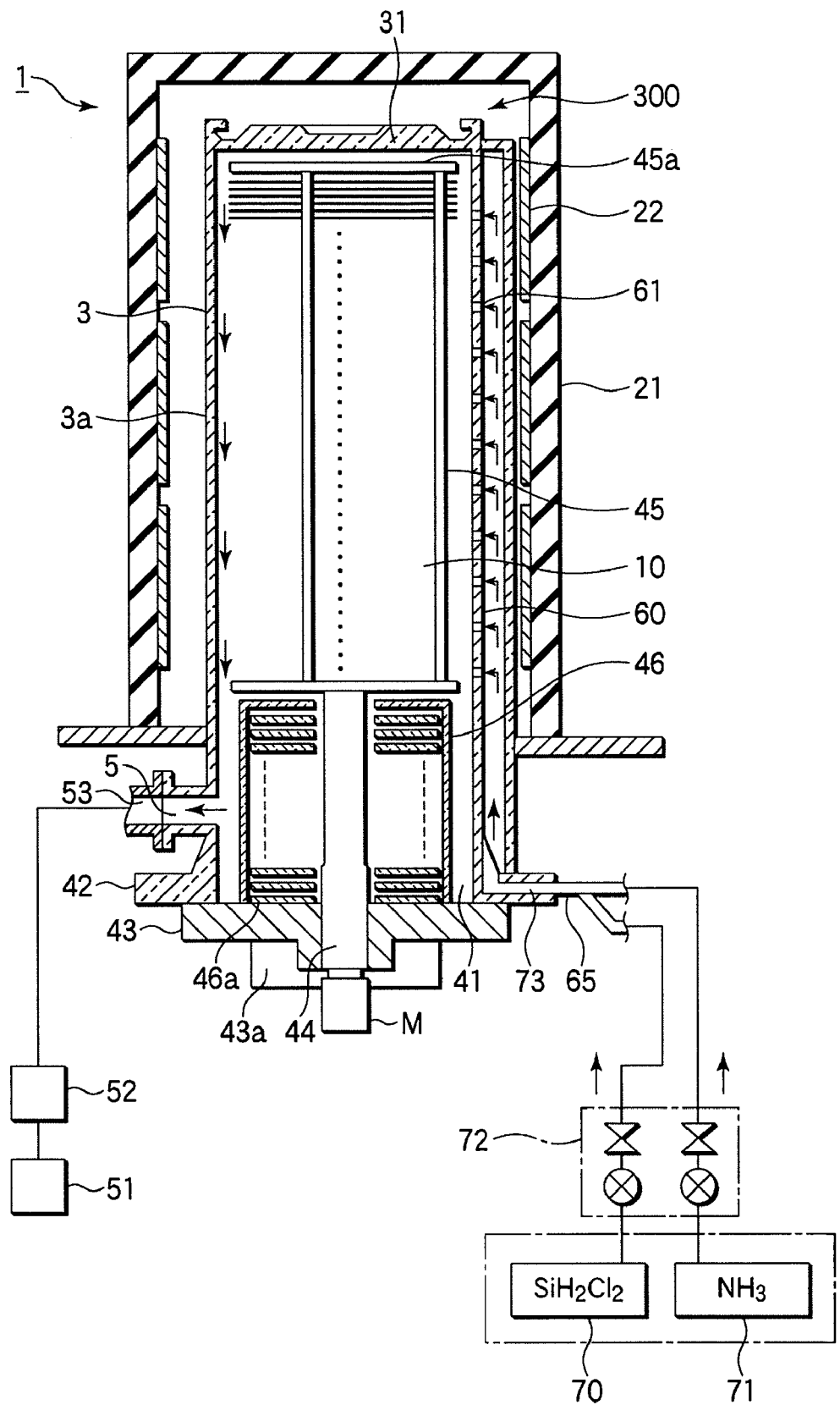
FIG. 1 is a sectional view schematically showing a heat processing apparatus 1 for a semiconductor process according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

First Embodiment

FIG. 1 is a sectional view schematically showing a heat processing apparatus 1 for a semiconductor process according to a first embodiment of the present invention. As shown in FIG. 1, this heat processing apparatus 1 includes a cylindrical body 21 made of, e.g., a heat insulating material, and annular heaters 22 disposed along the inner surface of the cylindrical body 21. A reaction tube 3 integrally made of an electrically insulating and heat-resistant material, such as quartz, and having an essentially cylindrical shape is disposed inside the cylindrical body 21. The reaction tube 3 has a perfect circle shape in the horizontal sectional view, and is opened on one end (the lower end in this embodiment) as a furnace port (transfer port) 41 and is closed on the other end (the upper end in this embodiment) as a flat closed end 30. The furnace port 41 is provided with a flange 42 at the periphery, and can be opened and closed by a lid 43 movable up and down by a boat elevator 43a. In this embodiment, the reaction tube 3 is made of quartz, but it may be made of another electrically insulating and heat-resistant material, such as Si (silicon) or SiC (silicon carbide).

A heat insulation unit 46 containing a number of fins 46a and a rotary shaft 44 are disposed on the lid 43. The rotary shaft 44 is rotated by a motor M serving as a driving portion attached to the boat elevator 43a through the lid 43. A substrate holder or wafer boat 45 is attached to the upper side of the rotary shaft 44 and is configured to hold a plurality of, such as 125, substrates or wafers W at intervals in the vertical direction. Accordingly, the wafer boat 45 are loaded and unloaded to and from the reaction tube 3 by the lid 43 being moved up and down. The wafer boat 45 is rotated along with the rotary shaft 44 by the motor M when a heat process is performed on a plurality of wafers W together at a time.

Figure 4:
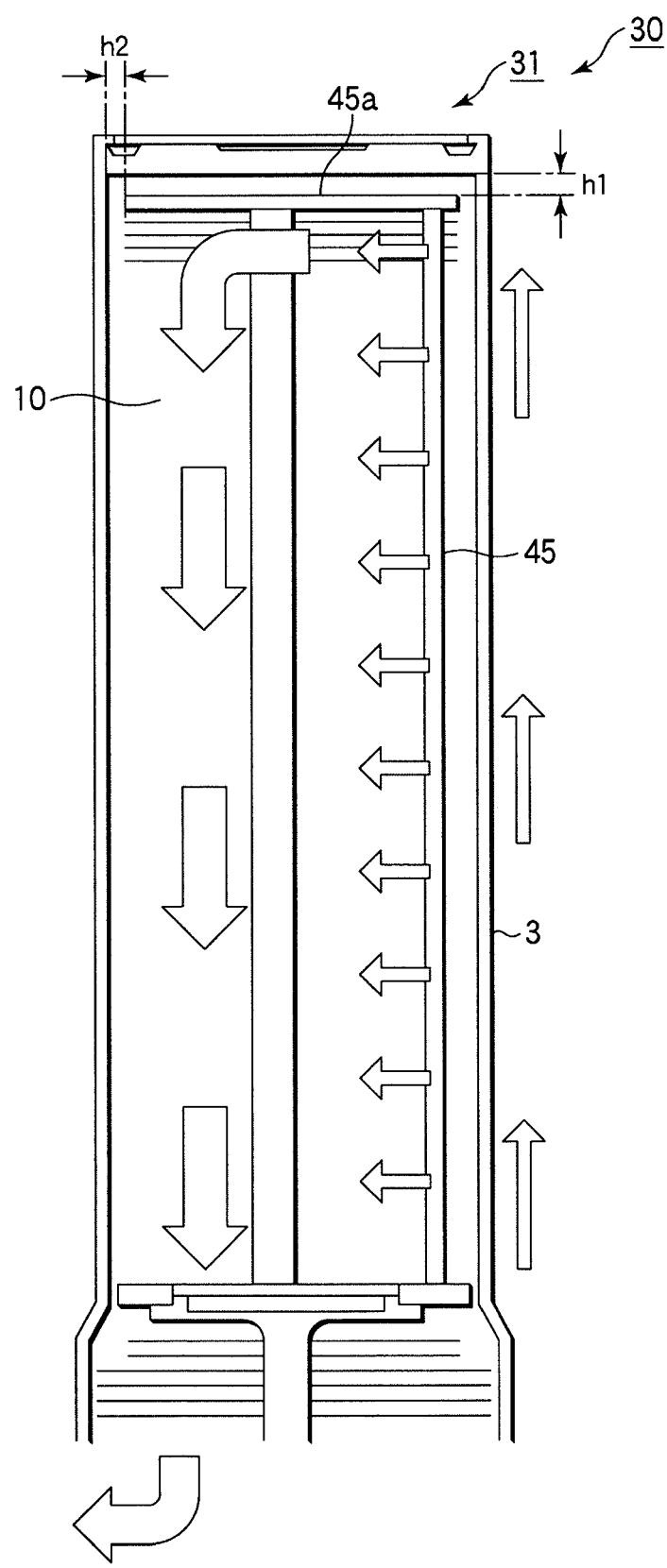
FIG. 4 is a view schematically showing flows of a process gas in the heat processing apparatus 1.

The wafer boat 45 with the wafers W held thereon is placed within the process field 10 inside the reaction tube 3 when a heat process is performed. At this time, the distance between the edge of the wafers W and the inner surface of the sidewall of the reaction tube 3 and the distance between the top plate 45a of the wafer boat 45 and the inner surface of the closed end 30 are preset to be as small as possible, so that the flow velocity of a process gas is high and the heat process on the wafers is uniform. As shown in FIG. 4, in this embodiment, the distance h1 between the top plate 45a of the wafer boat 45 and the inner surface of the closed end 30 is preset to be equal to or smaller than the distance h2 (such as 10 mm) between the edge of the wafers W and the cylindrical sidewall 3a of the reaction tube 3. In this embodiment, the distance h2 is 10 mm, but the distance h2 may be set to be 10 mm to 35 mm in accordance with associated factors, such as the shape of the reaction tube.

Figure 2:
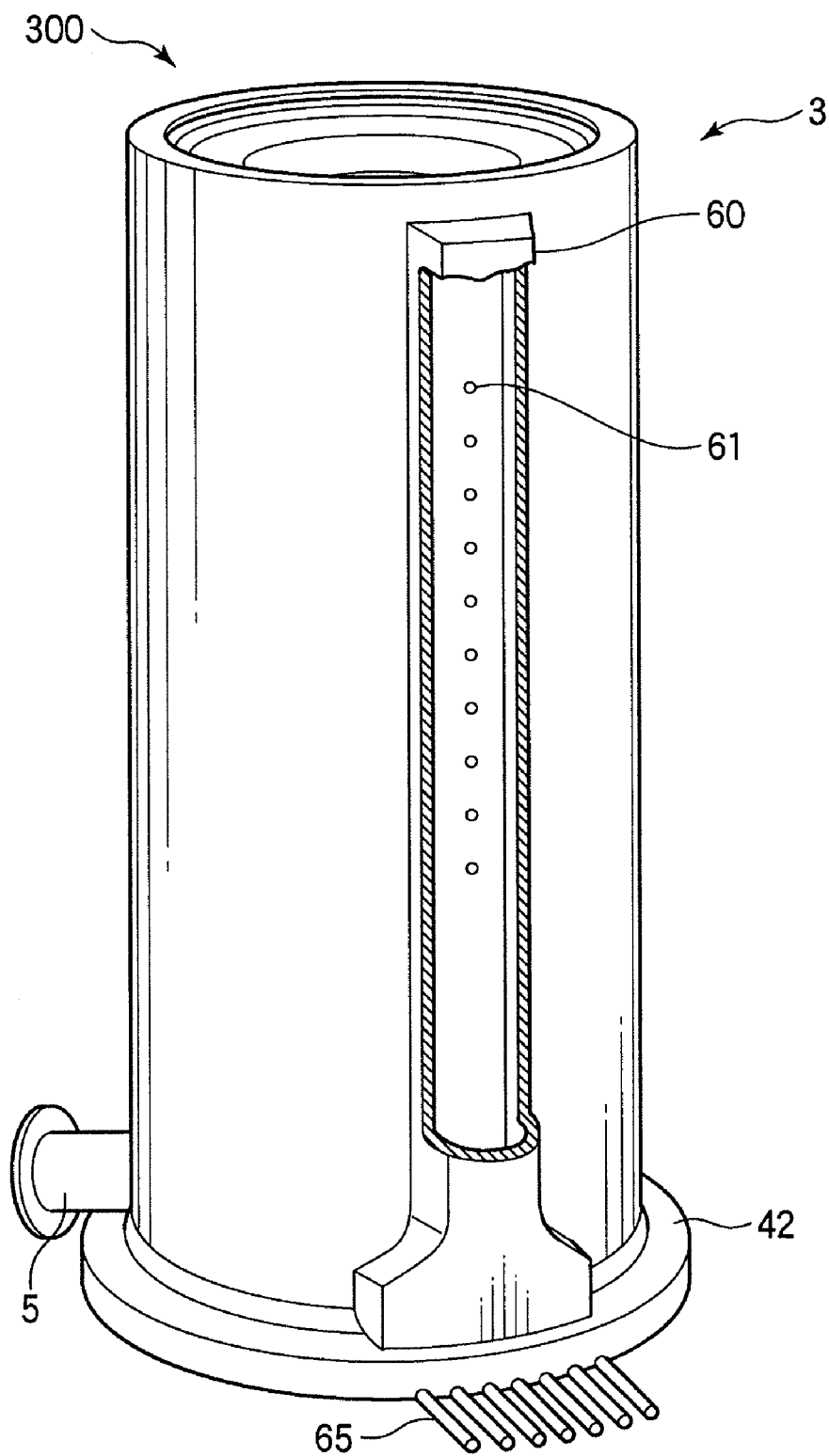
FIG. 2 is a perspective view showing a reaction tube used in the heat processing apparatus 1 shown in FIG. 1.

As shown in FIG. 2, a gas supply duct 60 formed of a flat casing having a vertically long narrow shape is attached on the outer surface of the sidewall 3a of the reaction tube 3 and serves as part of gas supply means. Gas delivery holes 61 are formed in the sidewall 3a at positions corresponding to the gas supply duct 60 and process field 10, so that the gas supply duct 60 communicates with the reaction tube 3 through the holes 61. In this embodiment, a process gas is supplied through the gas supply duct 60 and gas delivery holes 61 into the reaction tube 3. The gas delivery holes 61 are formed at a plurality of positions, such as 10 positions, at essentially regular intervals in the vertical direction, so that a process gas is swiftly supplied all over the process field 10. In this embodiment, the gas delivery holes 61 are arrayed in one vertical row, but they may be arrayed in a plurality of rows, such as two vertical rows.

For example, seven gas passages 73 are formed in the flange 42 in radial directions, and one ends of the respective gas passages 73 are connected to the gas supply duct 60 at the root portion of the flange 42. The other end of the respective gas passages 73 are connected to seven gas supply lines 65, which are connected to different gas supply sources, for example. FIG. 1 shows a gas source 70 of dichlorosilane ($SiH_2Cl_2$) and a gas source 71 of ammonia ($NH_3$), as examples. The gas supply lines are provided with a gas supply hardware set 72 including valves and flow rate controllers. The reaction tube 3 has an exhaust port 5 on a lower side, which is connected to an exhaust line 53. The exhaust line 53 is provided with a pressure regulator 52 including a butterfly valve and so forth, and a vacuum exhaust means or vacuum pump 51.

Figure 3A:
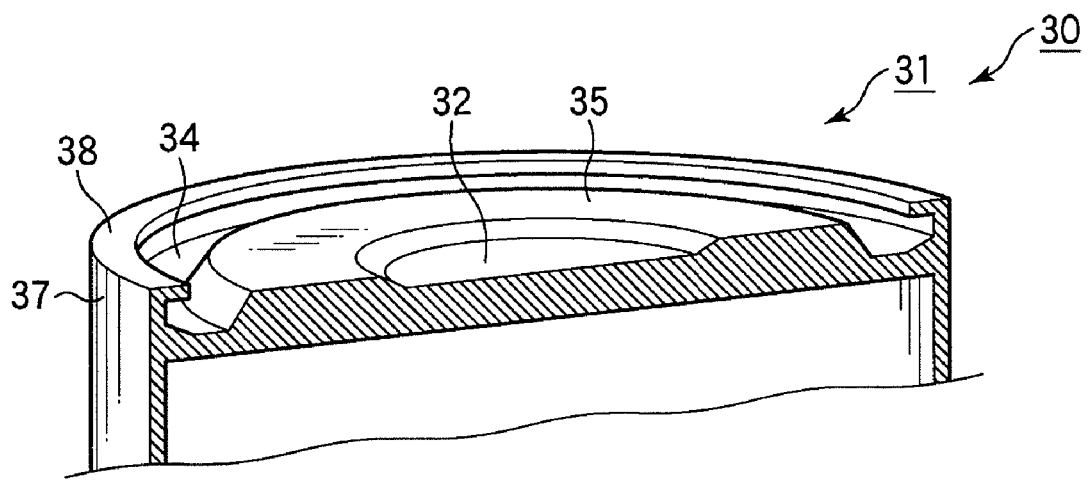
FIGS. 3A and 3B are a perspective view and a sectional view, respectively, showing the shape of the closed end 30 of the reaction tube show in FIG. 2.
Figure 3B:
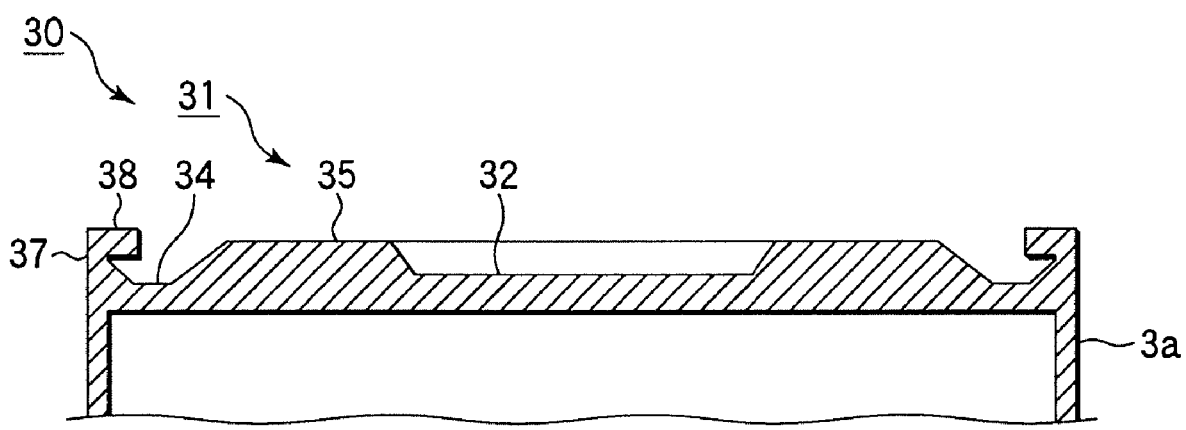

Next, a detailed explanation will be given of the closed end 30 of the reaction tube 3 with reference to the FIGS. 3A and 3B. FIG. 3B omits part of the apparatus to clarify the shape of the closed end 30. As shown in FIGS. 3A and 3B, the closed end 30 includes a circular ceiling wall 31 serving as a closed end wall of the reaction tube 3 at the other end. The ceiling wall 31 has a flat inner surface extending in a direction perpendicular to the axial direction of the reaction tube 3. The ceiling wall 31 has a symmetric shape and preferably the same symmetric shape relative to the axis of the reaction tube 3 in any cross section in a radial direction. On the upper surface (outer surface), the ceiling wall 31 has a circular recess 32 formed in the center region, and an annular groove 34 formed in the peripheral region and extending in an annular direction along the cylindrical sidewall 3a of the reaction tube 3. An annular protrusion 35 is defined between the circular recess 32 and annular groove 34. The side surface of the circular recess 32 is inclined upward and outward, so that the cross sectional shape of the circular recess 32 forms an inverted trapezoid. The inner side surface of the annular groove 34 is inclined upward and inward. The outer side surface of the annular groove 34 is inclined upward and outward. The wall thickness at the bottom of the annular groove 34 is smaller than the wall thickness at the bottom of the circular recess 32.

Since the outer side surface of the annular groove 34 is inclined, this portion of the ceiling wall 31 (the portion below the outer corner of the annular groove 34) has a larger wall thickness than that of the bottom of the annular groove 34. A rising portion 37 is formed as a vertical extension of the cylindrical sidewall 3a of the reaction tube 3 and thus has an annular shape extending along the peripheral edge of the ceiling wall 31. The rising portion 37 has an upper end 38 located above the upper surface of the annular protrusion 35 and bent inward at an angle of 90° to extend in a horizontal direction. The upper end 38 of the rising portion 37 is highest on the outer surface of the ceiling wall 31.

Next, an explanation will be given of an operation of the heat processing apparatus 1. At first, the wafer boat 45 with 125 wafers W held thereon is loaded into the reaction tube 3 by the boat elevator 43a, the reaction tube 3 is airtightly closed by the lid 43, and the pressure inside the reaction tube 3 is decreased by the vacuum pump 51 to, e.g., 27 Pa (0.2 Torr). Then, the interior of the reaction tube 3 is heated by the heaters 22 to a predetermined process temperature of, e.g., 600° C. This process temperature is controlled such that the wafers W inside the reaction tube 3 has a constant temperature (within a range of the set temperature ±1 to 2%, i.e., 600° C.±5° C.). Alternatively, the heaters 22 may be controlled to form a temperature inclination inside the reaction tube 3, for example.

Then, the gas supply hardware set 72 is operated to supply process gases, such as $SiH_2Cl_2$ gas and $NH_3$ gas from the gas sources 70 and 71 through the gas supply lines 65 and gas passages 73 into the gas supply duct 60. The process gases flow upward inside the gas supply duct 60 while being heated, and are delivered through the gas delivery holes 61 into the reaction tube 3. Then, the process gases flow downward through the narrow gap between the wafers W and the inner surface of the reaction tube 3, while they diffuse from this gap toward the center of the wafers W, and so a silicon nitride film is formed on the surface of the wafers W. Then, gas containing non-reacted part of the process gases and by-products is exhausted by the vacuum pump 51 through the exhaust port on the lower side of the reaction tube 3. In this way, a series of steps of the film formation process are performed.

According to the heat processing apparatus 1, as shown in FIG. 4, the ceiling wall 31 has a flat shape such that the distance h1 between the top plate 45a of the wafer boat 45 and the inner surface of the closed end 30 is equal to or smaller than the distance h2 between the edge of the wafers W and the sidewall 3a of the reaction tube 3. Consequently, the flow velocity of the process gases is increased between the closed end 30 and top plate 45a, and thereby prevents the process gases from staying above the wafer boat 45.

Figure 5:
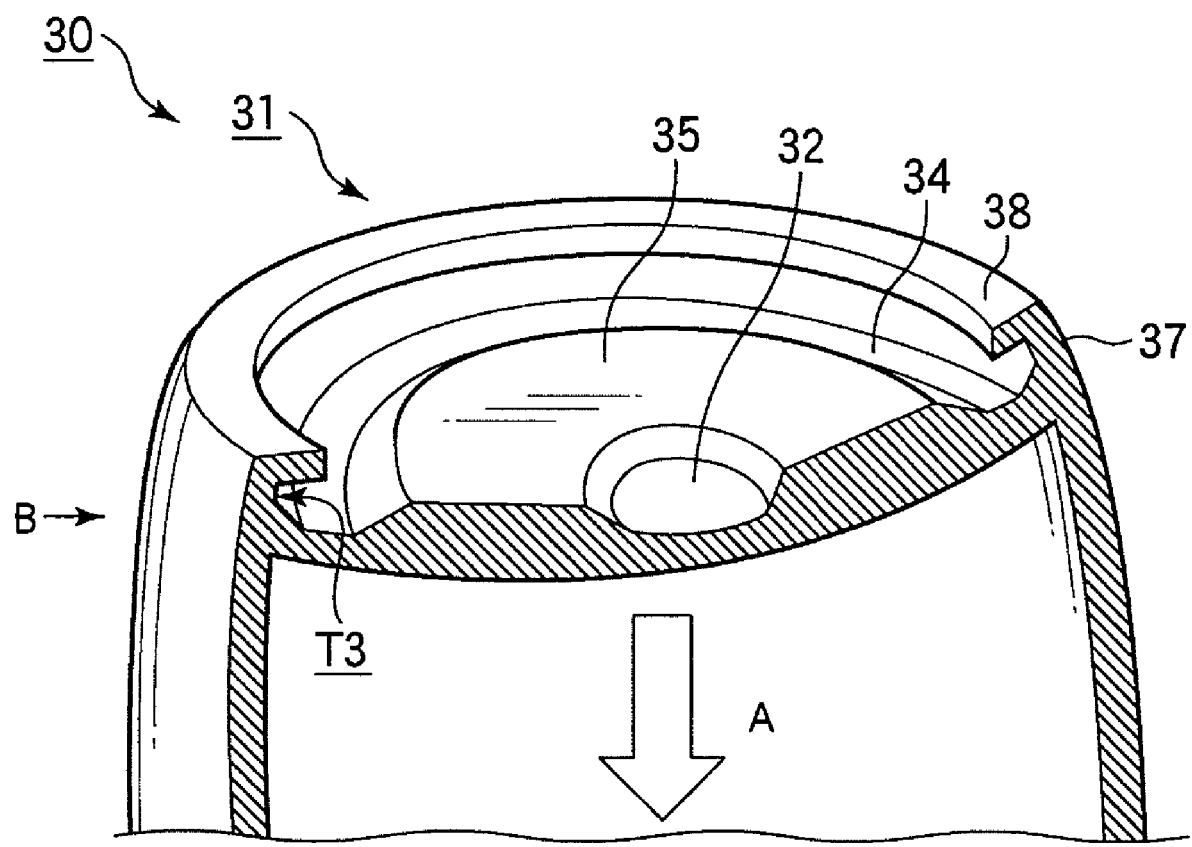
FIG. 5 is a view showing the shape of a closed end 30 according to a modification of the first embodiment.

Since the heat process described above is performed under a vacuum atmosphere, a pressure difference is generated between the outside and inside of the reaction tube 3. Due to this pressure difference, stresses toward the inside of the reaction tube 3 are generated on the sidewall 3a and ceiling wall 31 of the reaction tube 3. Of these stresses, the stress applied on the sidewall 3a is dispersed by the circular tube shape of the sidewall 3a, and so the stress concentration on the sidewall 3a of the reaction tube 3 is relaxed. On the other hand, the closed end 30, which comprises the flat ceiling wall 31, cannot disperse the inward stress, but receives the stress as indicated by an arrow W in FIG. 5. The ceiling wall 31 is pulled downward by this stress, and so the upper end of the sidewall 3a connected to the ceiling wall 31 receives a stress toward the center of the reaction tube 3.

However, according to this embodiment, a wall thickness L3 of the ceiling wall 31 below the annular groove 34 is set smaller than those of the other portions of the ceiling wall 31, so that a stress concentration is caused at this annular groove 34. This arrangement can relax a radially inward stress at the upper end of the sidewall 3a (in the direction indicted by an arrow B), i.e., a stress that pulls the upper end of the sidewall 3a inward. The stress in the arrow B direction applied on the annular groove 34 tends to concentrate at the outer corner of the annular groove 34. However, this outer corner is provided with a surface inclined upward and outward from the bottom of the annular groove 34 so that the wall thickness is increased at this position. Consequently, the stress to be concentrated at this corner is dispersed, and so the annular groove 34 is prevented from suffering an excessive local stress concentration generated therein.

Further, a downward and outward stress tends to concentrate to some extent near this inclined surface of the annular groove 34. However, the rising portion 37 with the upper end 38 is continuously formed upward from the annular groove 34, and serves to effectively disperse the stress to be concentrated near the inclined surface. In other words, when a stress is applied to the sidewall 3a to expand it outward, the rising portion 37 formed as an extension of the sidewall 3a is deformed such that it falls toward the center of the reaction tube 3. Then, the rising portion 37 and upper end 38 having an annular shape are deformed in the same way as in the case where a uniform stress is applied inward to this annular shape. Then, the rising portion 37 and upper end 38 react against this deformation and thereby generate a repulsive force, which disperses the stress, and prevent the sidewall 3a from being deformed.

For the reasons described above, the heat processing apparatus 1 according to this embodiment includes the closed end 30 comprising the ceiling wall 31 provided with the annular groove 34 on the peripheral region of the upper surface. When a vacuum state is formed inside the reaction tube 3, a stress directed inward is applied to the ceiling wall 31 in a direction across the axial direction of the reaction tube 3, but this stress is dispersed by the annular groove 34. Further, the portion below the outer corner of the annular groove 34 has a larger wall thickness than those of the other portions of the annular groove 34, so that a stress applied to the outer corner of the annular groove 34 is dispersed. Consequently, even though the closed end 30 of the reaction tube 3 comprises the flat ceiling wall 31, the reaction tube 3 is prevented from causing implosion when a vacuum state is formed therein.

With the heat processing apparatus 1 using this reaction tube 3 according this embodiment, since the unnecessary space due to a domed shape of the closed end 30 is not present any more, the flow velocity of a process gas flowing between the closed end 30 and top plate 45a is increased, and thereby prevents the process gas from staying above the wafer boat 45 and from being excessively decomposed by that much. Consequently, a heat process can be performed with high planar uniformity particularly on wafers W on the upper side, and the inter-wafer uniformity of the film thickness is also improved. In addition, the height of the apparatus can be smaller.

Second Embodiment

Figure 6:
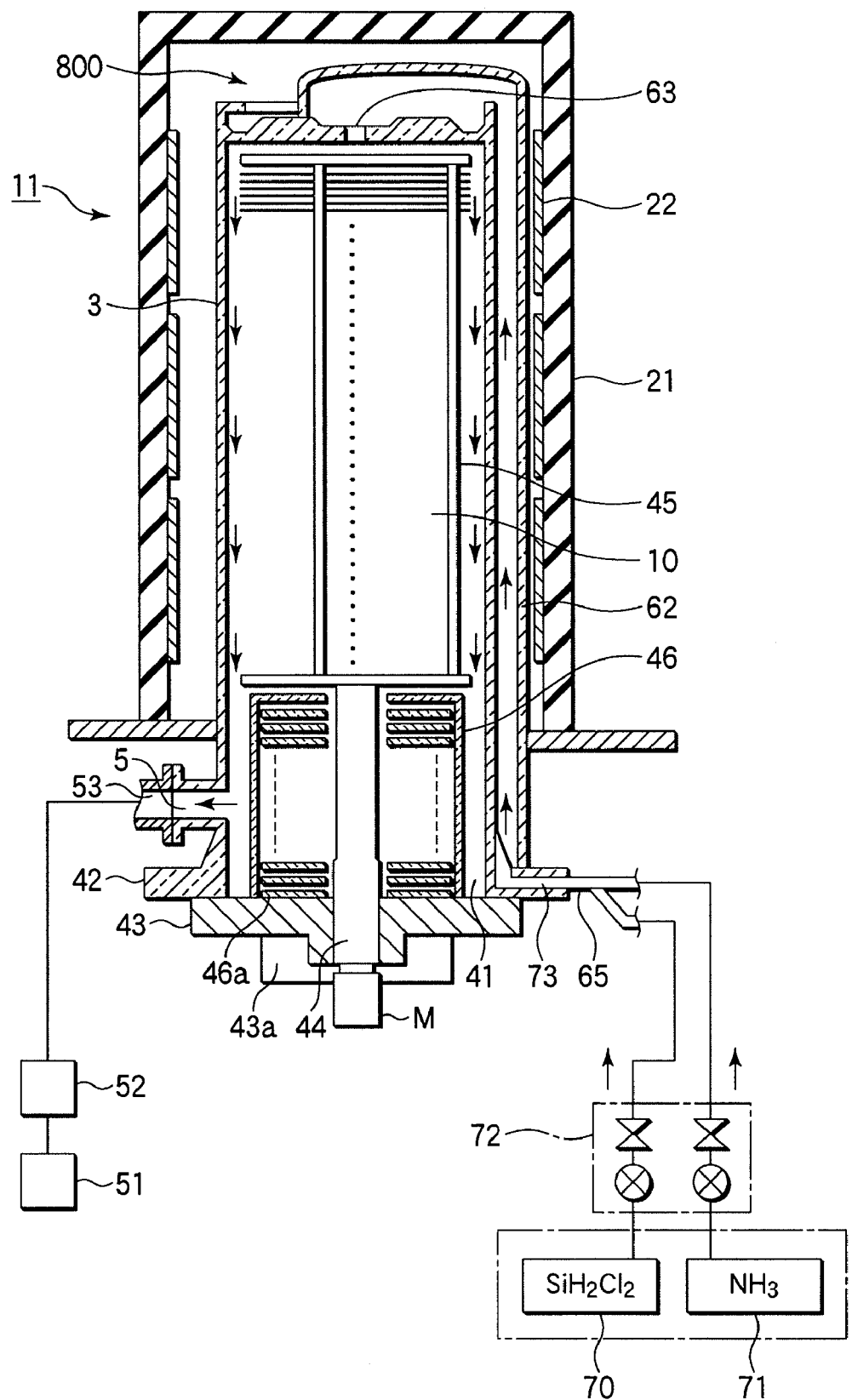
FIG. 6 is a sectional view schematically showing a heat processing apparatus 11 for a semiconductor process according to a second embodiment of the present invention.

FIG. 6 is a sectional view schematically showing a heat processing apparatus 11 for a semiconductor process according to a second embodiment of the present invention. As shown in FIG. 6, the heat processing apparatus 11 includes a reaction tube 8 having a large gas delivery port 63 at the center of a closed end 80 and a gas supply duct 62 extending to the top of the reaction tube 8. In the heat processing apparatus 11, the closed end 80 includes a flat ceiling wall 81 so that the distance between the top plate 45a of the wafer boat 45 and the ceiling wall 81 is smaller. In this case, the flow velocity of a process gas is increased and thereby causes a process gas supplied from the gas delivery port 63 to be swiftly supplied without staying above the process field 10. Consequently, the heat processing apparatus 11 according to the second embodiment can provide the same effect and advantage as those of the heat processing apparatus 1 according to the first embodiment, thereby improving the processing rate of wafers W. In this embodiment, the reaction tube 8 has only one gas delivery port 63, but the reaction tube 8 may be provided with gas delivery ports 61 formed on the sidewall 8a to communicate with the gas supply duct 62, as in the first embodiment, for example.

Third Embodiment

Figure 7:
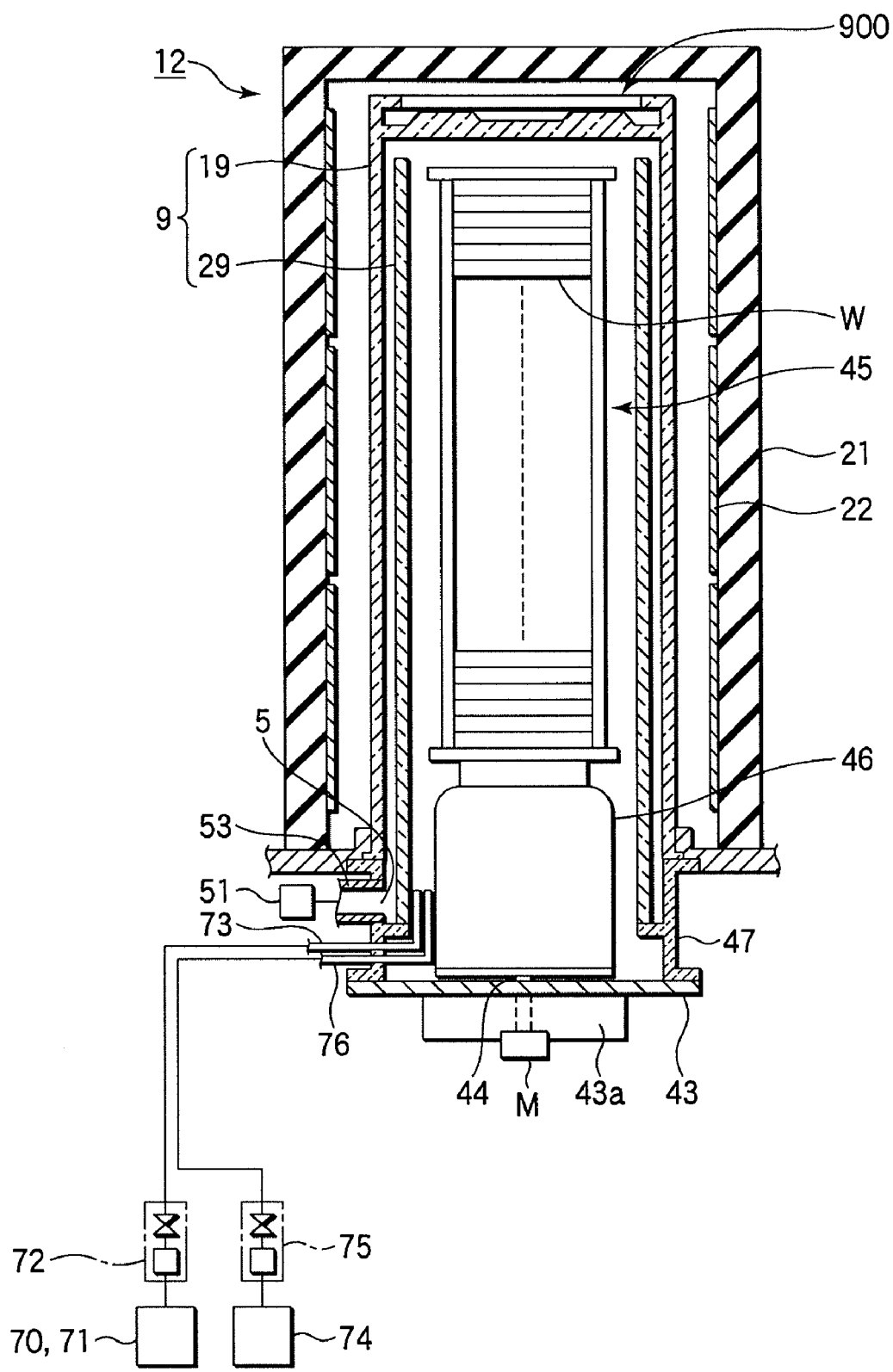
FIG. 7 is a sectional view schematically showing a heat processing apparatus 12 for a semiconductor process according to a third embodiment of the present invention.

FIG. 7 is a sectional view schematically showing a heat processing apparatus 12 for a semiconductor process according to a third embodiment of the present invention. As shown in FIG. 7, the heat processing apparatus 12 includes a reaction tube 9 having a double-tube structure formed of an outer tube 19 and an inner tube 29. The outer tube 19 is made of quartz and has a closed upper end and an opened lower end. The inner tube 29 is made of quartz and is formed of a straight tube with opened ends on the opposite sides. The outer tube 19 and inner tube 29 are supported by a manifold 47 at the lower ends. The lower end opening of the manifold 47 serves as a load port for the wafer boat 45.

A plurality of gas feed pipes are inserted into the manifold 47, and each of the gas feed pipes (73 and 76) is bent from a horizontal direction to a vertical direction to provide a gas feed port facing upward inside the inner tube 20. FIG. 7 shows only the two gas feed pipes 73 and 76, for the sake of convenience. The manifold 47 is connected to an exhaust line 53, which is opened to the gap between the outer tube 19 and inner tube 29. Accordingly, when a gas is supplied at the bottom of the inner tube 29, the gas flows upward inside the inner tube 29, then flows downward through the gap between the outer tube 19 and inner tube 29, and is then exhausted through the exhaust line 53. The upper closed end 90 of the outer tube 19 includes a flat ceiling wall 91, which has the same structure as the ceiling wall 31 according to the first embodiment.

In the heat processing apparatus 12 having the structure described above, the closed end 90 of the outer tube 19 of the reaction tube 9 is formed as in the closed end 30 according to the first embodiment, so that the closed end 90 has a flat shape. In this case, the upper space above the process field 10 for processing wafers W becomes narrower, so that, after a process gas flows upward through the wafer boat 45, the process gas swiftly flows into the gap between the outer tube 19 and inner tube 29 without staying in the upper space for a long time. Consequently, it is expected that the process gas can be hardly re-diffused from the upper space into the process field, so that the inter-wafer uniformity of the process is improved by solving such a problem that a heat process is locally more developed, e.g., the film formation rate becomes locally larger, on wafers W near the upper end of the wafer boat 45 than on wafers W on the lower side. Further, the planar uniformity of the process is also improved for wafers W near the upper end of the wafer boat 45 by solving such a problem that the film formation rate becomes larger at the peripheral portion than at the center of the wafers W. In addition, the height of the apparatus can be smaller as compared to an apparatus including a conventional outer tube having a domed shape.

Fourth Embodiment

Figure 8:
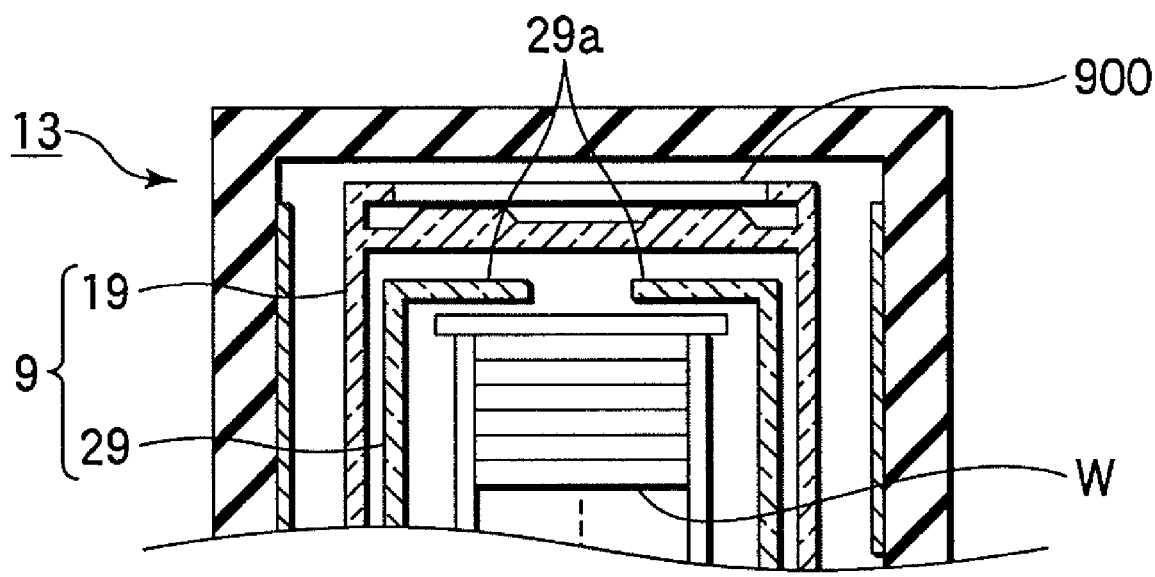
FIG. 8 is a sectional view schematically showing part of a heat processing apparatus 13 for a semiconductor process according to a fourth embodiment of the present invention.

FIG. 8 is a sectional view schematically showing part of a heat processing apparatus 13 for a semiconductor process according to a fourth embodiment of the present invention. As shown in FIG. 8, the heat processing apparatus 13 is a modification of that of the third embodiment, such that the inner tube 29 is provided with a fin 29a at the upper opening end, which horizontally extends toward the central axis of the inner tube. Since the other portions of the fourth embodiment are the same as those of the third embodiment, FIG. 8 merely shows the upper side of the heat processing apparatus 13. In the heat processing apparatus 13, the gap between the ceiling wall 91 of the closed end 90 and the fin 29a is narrower, and so the flow velocity of a process gas is increased. Further, the fin 29a can prevent active components from falling from the upper space of the reaction tube 9. Consequently, the fourth embodiment is expected to enhance the effect and advantage provided by the heat processing apparatus 12 according to the third embodiment.

Other Embodiments

Figure 9A:
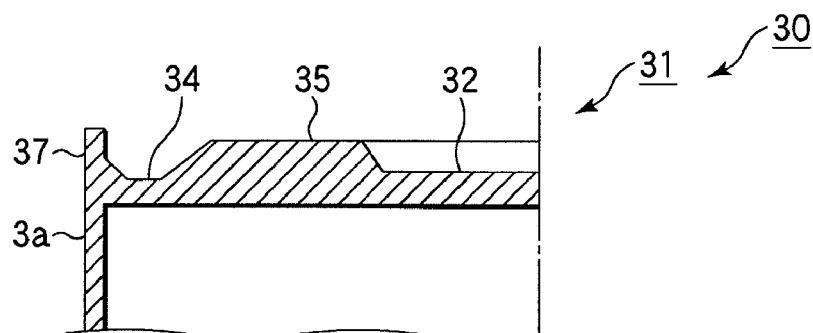
FIGS. 9A to 9D are views showing the shape of a closed end 30 according to other embodiments of the present invention.
Figure 9B:
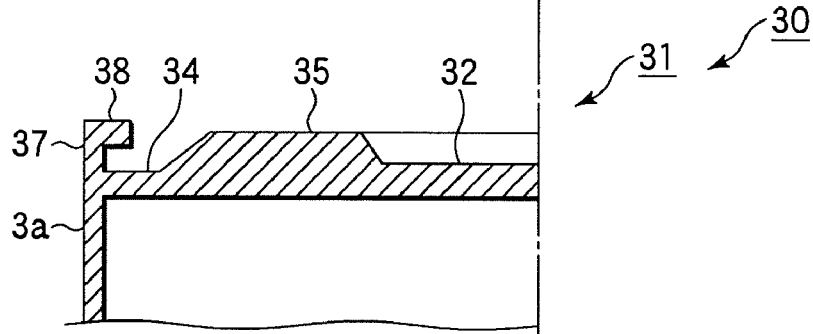

The present invention has been described with reference to several embodiments, but the present invention is not limited to these embodiments, and it may be modified in various manners. FIGS. 9A to 9D are views showing the shape of a closed end 30 according to other embodiments of the present invention, taking the ceiling wall 31 of the reaction tube 3 according to the first embodiment as an example. For example, as shown in FIG. 9A, the rising portion 37 may have an upper end that is not bent. This structure cannot provide the advantage obtained by the bent rising portion 37, but can prevent implosion of the reaction tube 3 because the ceiling wall 31 has a higher strength than that of a ceiling wall having a flat upper surface. As shown in FIG. 9B, the outer corner of the annular groove 34 may be formed with a right angle in place of the inclined side surface that provides a larger wall thickness. This structure cannot provide the advantage obtained by the larger wall thickness below the outer corner, but can provide the effect of dispersing a stress by the annular groove 34 and rising portion 37 and can prevent implosion of the reaction tube 3 because the ceiling wall 31 has a higher strength than that of a ceiling wall having a flat upper surface. In the structure shown in FIG. 9B, the rising portion 37 is bent, but it may be not bent.

Figure 9C:
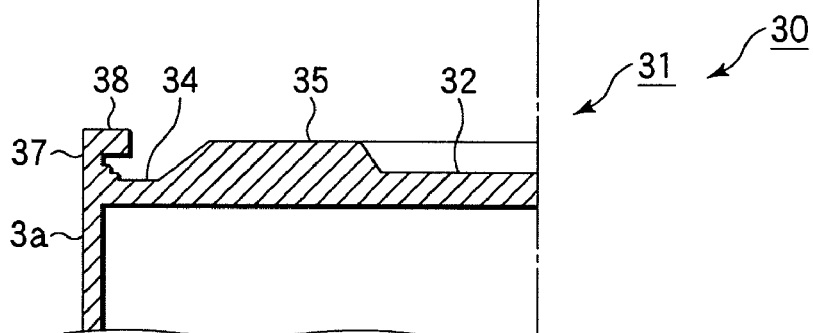
Figure 9D:
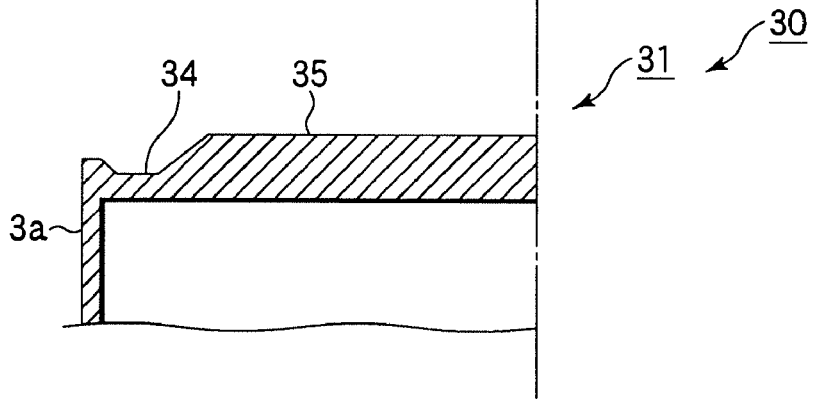

As shown in FIG. 9C, the outer side surface of the annular groove 34 may be formed as an inclined side surface with a stepped shape in place of the simply inclined side surface. This structure can provide an effect and an advantaged similar to those of the simply inclined side surface and can prevent implosion of the reaction tube 3 because the ceiling wall 31 has a higher strength than that of a ceiling wall having a flat upper surface. As described above with reference to the embodiments, problems are caused by a stress applied to the sidewall 3a from the ceiling wall 31. Accordingly, another embodiment of the present invention may be arranged to merely disperse this stress. For example, in another embodiment of the present invention, as shown in FIG. 9D, a ceiling wall 31 may be provided merely with the annular groove 34 to disperse a stress applied to the ceiling wall 31, so that the ceiling wall 31 has a higher strength than that of a ceiling wall having a flat upper surface. In this case, the outer side surface of the annular groove 34 is inclined, so that the portion below the outer corner of the annular groove 34 has a larger wall thickness, thereby improving the strength to effectively prevent implosion of the reaction tube 3.

<Experiment>

Next, an explanation will be given of experiments performed to confirm effects of the present invention, with reference to FIGS. 10A to 10D.

Figure 12:
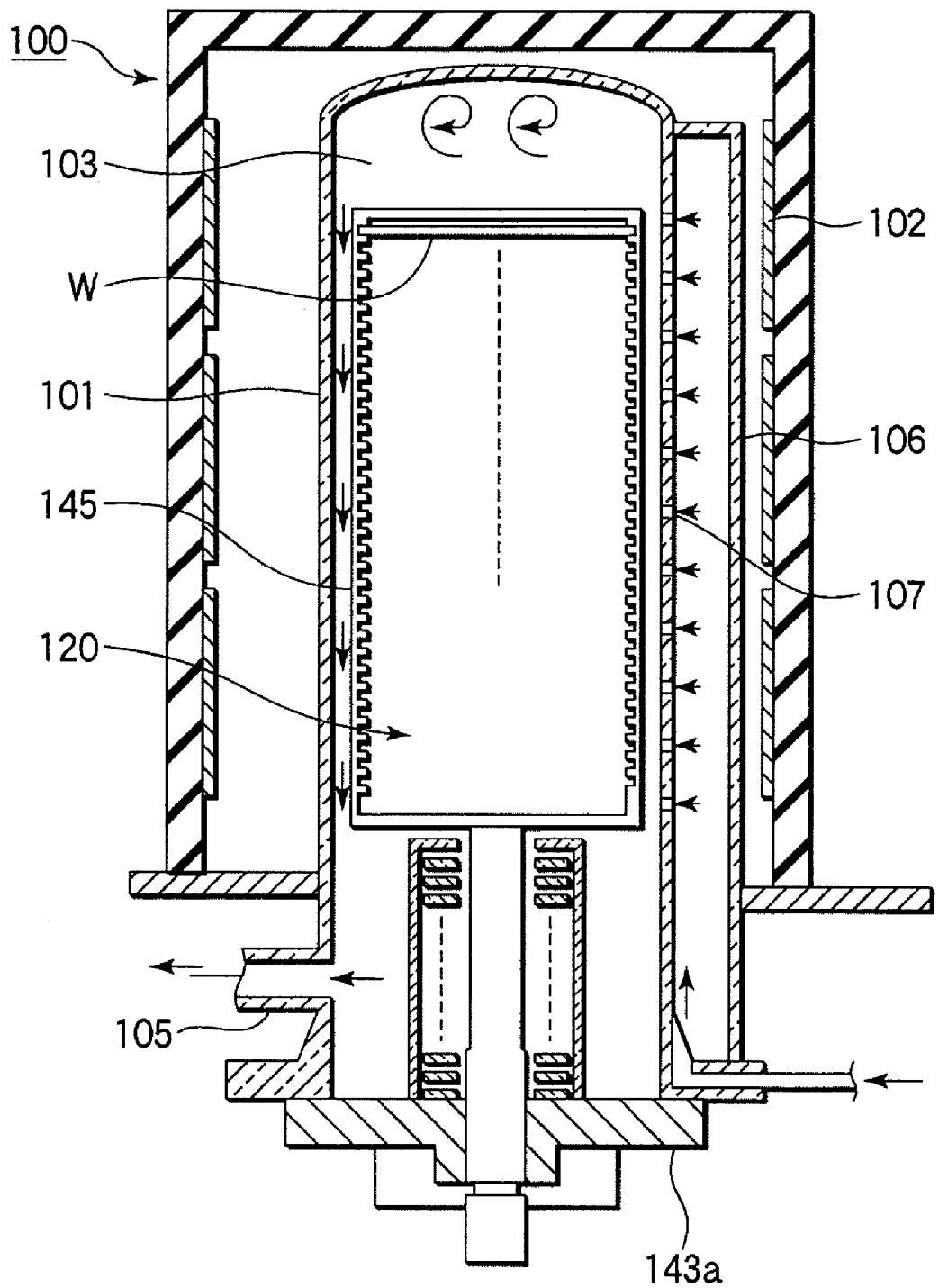
FIG. 12 is a sectional view schematically showing a conventional heat processing apparatus.
Figure 13:
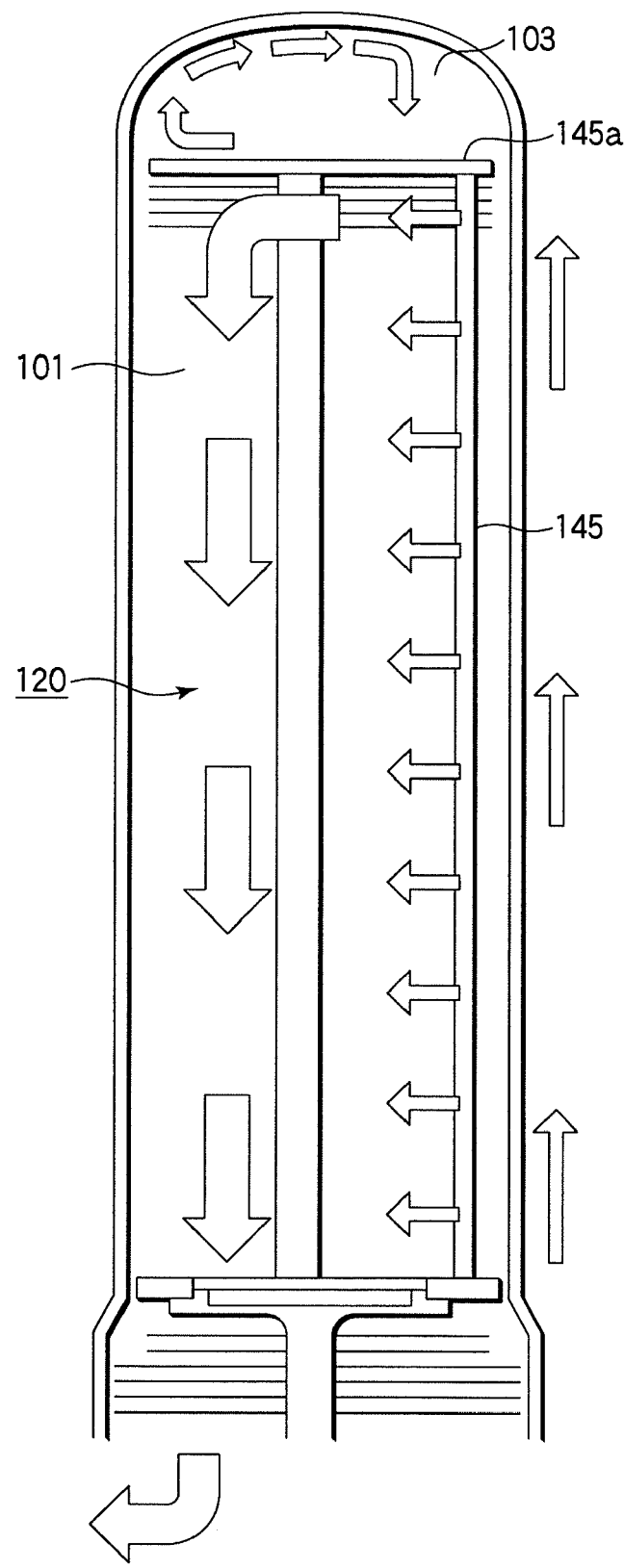
FIG. 13 is a view schematically showing flows of a process gas in the conventional heat processing apparatus 100.

As a present example, a film formation process of forming a silicon nitride film doped with carbon was performed by use of the heat processing apparatus 1 according to the first embodiment under process conditions in which 85 ml of hexachlorodisilane ($Si_2Cl_6$) gas, 425 ml of ammonia ($NH_3$) gas, and 1,800 ml of ethylene ($C_2H_4$) gas were supplied as process gases to wafers. The process pressure was set at 27 Pa (0.2 Torr), and the process temperature was set at 600° C. Further, as a comparative example, a film formation process was performed by use of the conventional heat processing apparatus 100 shown in FIG. 12 under the same conditions as those for the present example. Test wafers W were placed in selected five slots of the wafer boat 45 or 145, and the average film thickness of the silicon nitride film doped with carbon formed on each of the wafers W was used to calculate a film formation rate as well as the film thickness planar uniformity. Before the heat process was actually performed, the temperature distribution inside the process field 10 or 120 was measured and the heaters were adjusted to set the temperature of the wafers W to be constant.

Figure 10A:
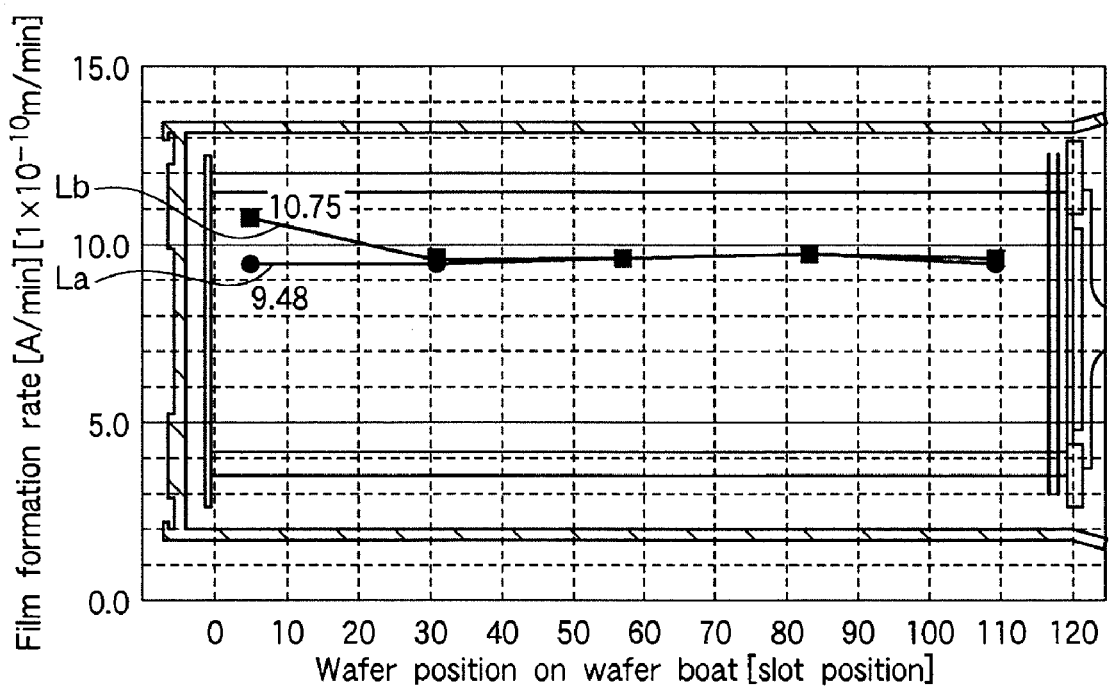
FIGS. 10A and 10B are graphs showing results of experiments using a present example of the present invention and a comparative example.
Figure 10B:
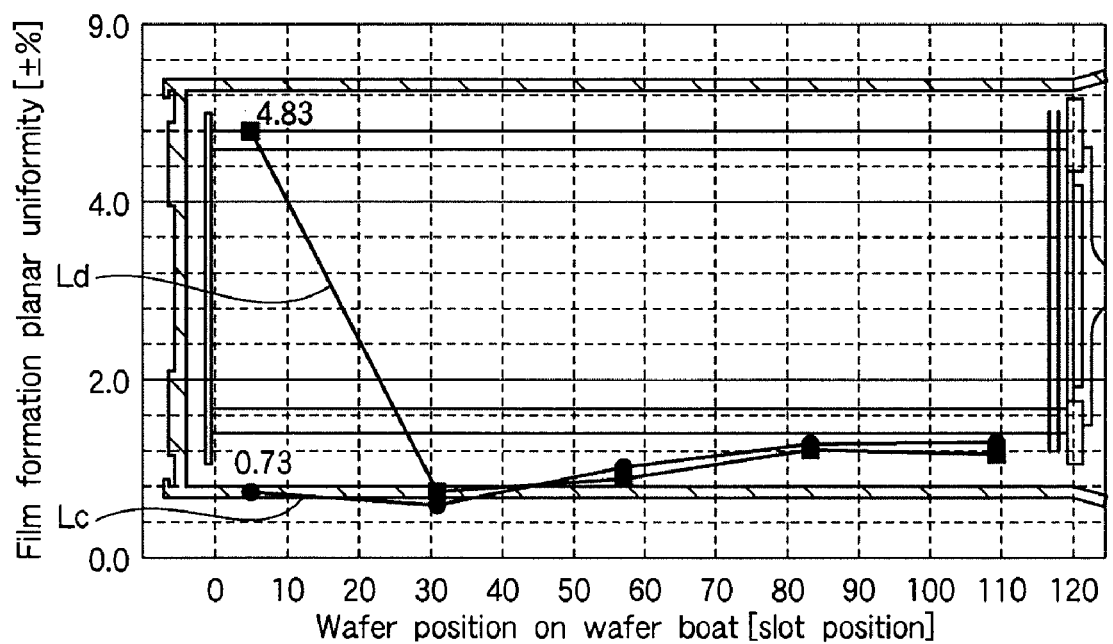

FIGS. 10A and 10B are graphs showing results of these experiments. In FIG. 10A, the vertical axis denotes the film formation rate and the horizontal axis denotes the position of the wafers W held on the wafer boat 45 (slot position) such that slot position No. 1 is the uppermost slot position. In FIG. 10B, the vertical axis denotes the film formation planar uniformity, and the horizontal axis denotes the slot position as in FIG. 10A. In these graphs, lines La and Lc connecting "●" represent the present example using the heat processing apparatus 1, and lines Lb and Ld connecting "■" represent the comparative example using the conventional heat processing apparatus 100. As shown in FIGS. 10A and 10B, in the comparative example, the film formation rate was larger and the film formation planar uniformity was worse on the wafer W near the top of the wafer boat 145 than on the wafers W therebelow. On the other hand, in the present example, the film formation rate and the film formation planar uniformity were almost constant over all the wafers W including the wafer W near the top of the wafer boat 45. Accordingly, in this case, not only the planar uniformity but also the inter wafer uniformity was better. Accordingly, it has been confirmed that the reaction tube 3 having the flat upper end allows a heat process to be more uniformity performed as compared with the reaction tube 101 having the domed upper end.

<Simulation>

Next, an explanation will be given of simulations for analyzing the strength of a ceiling wall 31 according to the present invention when a stress was applied thereto, with reference to FIGS. 11A to 11C.

Figure 11A:
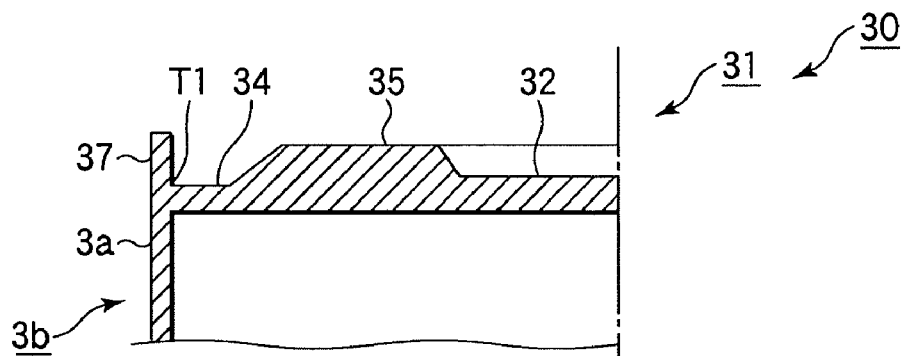
FIGS. 11A to 11C are views showing different shapes of the ceiling wall according to embodiments of the present invention, used in strength-analyzing simulations.
Figure 11B:
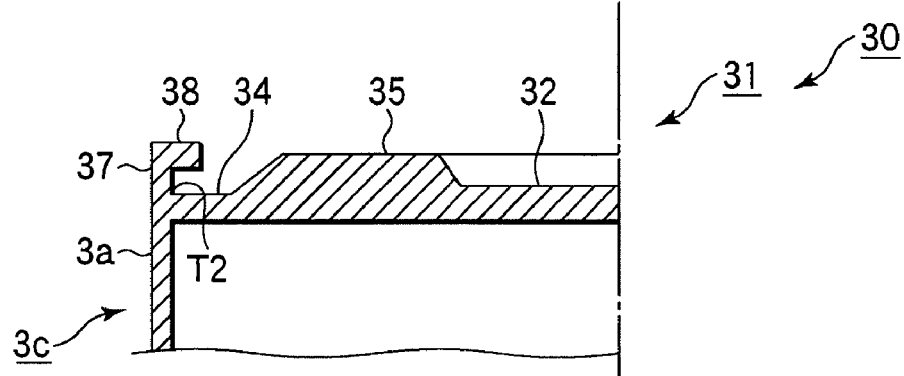
Figure 11C:
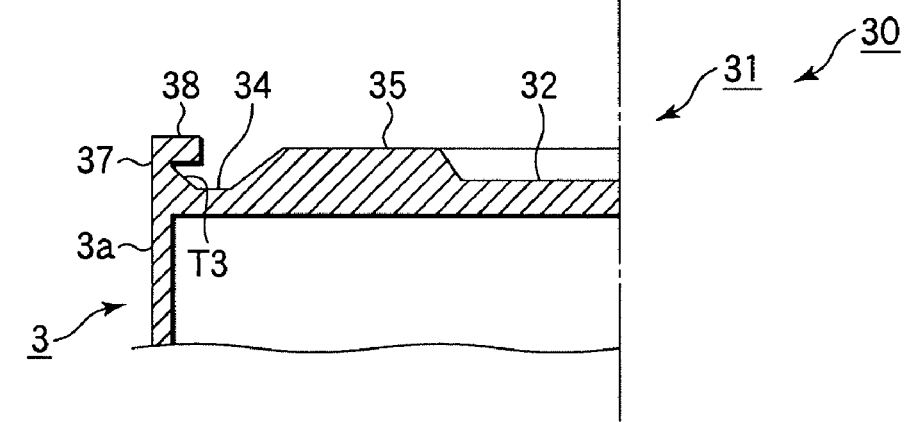

A simulation was performed such that the reaction tube 3 shown in FIG. 11C according to the first embodiment was vacuum-exhausted and set in a constant vacuum state to generate a stress due to a pressure difference between the outside and inside of the reaction tube 3. In this state, an analysis was performed as to how the stress thus applied to the reaction tube 3 acted on the ceiling wall 31. The same simulation was performed on a reaction tube 3 shown in FIG. 11A with a ceiling wall 31 that excluded the inclination of the outer side surface of the annular groove 34 and the upper end 38 of the rising portion 37. Further, the same simulation was performed on a reaction tube 3 shown in FIG. 11B with a ceiling wall 31 that excluded the inclination of the outer side surface of the annular groove 34 but had a larger wall thickness at the bottom of the annular groove 34.

In the case using the reaction tube 3 show in FIG. 11A, when a stress directed inward is applied to the reaction tube 3, the annular groove 34 attenuates the force that causes the sidewall 3a to be pulled radially inward by the ceiling wall 31, and so deformation of the sidewall 3a becomes smaller. In this case, the stress is about 19.84 [MPa] at the junction T1 between the sidewall 3a and ceiling wall 31 at which the stress concentration is largest, and so the ceiling wall 31 has a higher strength than that of a ceiling wall having a flat upper surface and can prevent implosion of the reaction tube 3. In the case using the reaction tube 3 show in FIG. 11B having a larger wall thickness at the bottom of the annular groove 34, the stress is about 12.55 [MPa] at the junction T2 between the sidewall 3a and ceiling wall 31 at which the stress concentration is largest. In this case, the larger wall thickness below the annular groove 34 increases the force that causes the sidewall 3a to be pulled radially inward by the ceiling wall 31, as compared to the reaction tube 3 shown in FIG. 11A, but the rising portion 37 and upper end 38 reliably block deformation of the sidewall 3a. Consequently, the reaction tube 3 show in FIG. 11B provides a larger strength of the ceiling wall 31 than that of the reaction tube 3 show in FIG. 11A and can more effectively prevent implosion of the reaction tube 3.

In the case using the reaction tube 3 shown in FIG. 11C having a smaller wall thickness at the bottom of the annular groove 34 and an inclined surface at the outer corner of the annular groove 34, a stress is concentrated at the annular groove 34 and dispersed by the inclined surface. In this case, the stress is about 4.80 [MPa] at the junction T3 between the sidewall 3a and ceiling wall 31 at which the stress concentration is largest, and so this arrangement can more reliably block deformation of the sidewall 3a. Consequently, the reaction tube 3 shown in FIG. 11c provides a larger strength of the ceiling wall 31 than those of the reaction tubes 3 show in FIGS. 11A and 11B and can more effectively prevent implosion of the reaction tube 3.

In a reaction tube according to an embodiment of the present invention, an annular groove is formed in the peripheral region of the outer surface of the closed end wall. When a vacuum state is formed inside the reaction tube, a stress directed inward is applied to the closed end wall in a direction across the axial direction of the reaction tube, but this stress is dispersed by the annular groove. Further, the portion below the outer corner of the annular groove has a larger wall thickness than those of the other portions of the annular groove, so that a stress applied to the outer corner of the annular groove is dispersed. Consequently, even though the closed end of the reaction tube is flat, the reaction tube is prevented from causing implosion when a vacuum state is formed therein. Further, this reaction tube can eliminate the unnecessary space due to a domed shape of the closed end wall, so that the flow velocity of a process gas flowing between the closed end wall of the reaction tube and substrates is increased, and the process gas is prevented from being decomposed more on the upper side of the reaction tube than on the lower side. Consequently, it is possible to improve the planar uniformity of film thickness particularly on substrates on the upper side, and to improve the inter-substrates uniformity of the film thickness between substrates on the upper side and substrates on the lower side. In addition, the height of the apparatus can be smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A reaction tube for a semiconductor process, the reaction tube having an inner space for performing a heat process on a plurality of target objects stacked at intervals under a vacuum state, the reaction tube being integrally made of an electrically insulating and heat-resistant material and comprising:
   a cylindrical sidewall that has a load port at a lower end for loading and unloading the target objects to and from the reaction tube, the sidewall defining a cylindrical side profile of the inner space; and
   a circular ceiling wall that closes an upper end of the sidewall and has a flat inner surface extending in a direction perpendicular to an axial direction of the sidewall, the flat inner surface of the ceiling wall defining a flat upper profile of the inner space,
   wherein the ceiling wall is integrated with the sidewall through an annular outer end of the circular ceiling wall present directly above the sidewall and includes an annular groove formed in a peripheral region of an outer surface opposite to the flat inner surface along the annular outer end, such that the annular groove has an annular outer side surface inclined outward and upward from a bottom thereof to the annular outer end and the ceiling wall has a larger wall thickness at the annular outer end than at the bottom of the annular groove, to relax a stress caused on the annular outer end due to the vacuum state in the inner space.

2. The reaction tube according to claim 1, wherein the ceiling wall includes an annular rising portion extending upward integrally from the annular outer end.

3. The reaction tube according to claim 2, wherein the rising portion has an upper end bent inward.

4. The reaction tube according to claim 3, wherein the upper end of the rising portion is bent inward essentially at 90°.

5. The reaction tube according to claim 3, wherein the upper end of the rising portion is highest on the outer surface of the ceiling wall.

6. The reaction tube according to claim 1, wherein the annular groove has an annular inner side surface inclined inward and upward from the bottom thereof.

7. The reaction tube according to claim 1, wherein the annular outer side surface of the annular groove is inclined with a stepped shape.

8. The reaction tube according to claim 1, wherein the ceiling wall has a central recess in a central region of the outer surface to form an annular protrusion between the central recess and the annular groove.

9. The reaction tube according to claim 8, wherein the central recess has an annular outer side surface inclined outward and upward.

10. A heat processing apparatus for a semiconductor process, the apparatus comprising:
    a reaction tube having an inner space for performing a heat process on a plurality of target objects stacked at intervals under a vacuum state;
    a heater that surrounds the reaction tube;
    a substrate holder configured to hold the target objects inside the reaction tube;
    a gas supply system connected to the reaction tube and configured to supply a process gas into the reaction tube; and
    a gas exhaust system connected to the reaction tube and configured to vacuum-exhaust gas from inside the reaction tube,
    wherein the reaction tube is integrally made of an electrically insulating and heat-resistant material and comprises
    a cylindrical sidewall that has a load port at a lower end for loading and unloading the target objects to and from the reaction tube, the sidewall defining a cylindrical side profile of the inner space, and
    a circular ceiling wall that closes an upper end of the sidewall and has a flat inner surface extending in a direction perpendicular to an axial direction of the sidewall, the flat inner surface of the ceiling wall defining a flat upper profile of the inner space,
    wherein the ceiling wall is integrated with the sidewall through an annular outer end of the circular ceiling wall present directly above the sidewall and includes an annular groove formed in a peripheral region of an outer surface opposite to the flat inner surface along the annular outer end, such that the annular groove has an annular outer side surface inclined outward and upward from a bottom thereof to the annular outer end and the ceiling wall has a larger wall thickness at the annular outer end than at the bottom of the annular groove, to relax a stress caused on the annular outer end due to the vacuum state in the inner space.

11. The apparatus according to claim 10, wherein the ceiling wall includes an annular rising portion extending upward integrally from the annular outer end.

12. The apparatus according to claim 11, wherein the rising portion has an upper end bent inward.

13. The apparatus according to claim 12, wherein the upper end of the rising portion is bent inward essentially at 90°.

14. The apparatus according to claim 12, wherein the upper end of the rising portion is highest on the outer surface of the ceiling wall.

15. The apparatus according to claim 10, wherein the annular groove has an annular inner side surface inclined inward and upward from the bottom thereof.

16. The apparatus according to claim 10, wherein the annular outer side surface of the annular groove is inclined with a stepped shape.

17. The apparatus according to claim 10, wherein the ceiling wall has a central recess in a central region of the outer surface to form an annular protrusion between the central recess and the annular groove.

18. The apparatus according to claim 17, wherein the central recess has an annular outer side surface inclined outward and upward.

19. The apparatus according to claim 10, wherein a vertical distance between a top plate of the substrate holder and the flat inner surface of the ceiling wall is set equal to or smaller than a horizontal distance between an edge of the target objects and the sidewall of the reaction tube.

20. The apparatus according to claim 19, wherein the horizontal distance is set to be 10 to 35 mm.

* * * * *